United States Patent [19]

Steingroever et al.

[11] 4,238,734
[45] Dec. 9, 1980

[54] APPARATUS FOR MEASURING THE MAGNETIC MOMENTS OF A BODY USING A MAGNETIC FIELD GENERATED BY A PERMANENT MAGNETIC

[76] Inventors: Erich A. Steingroever, Flensberger Strasse, 33 Bonn; Dietrich A. Steingroever, An der Schanz 2, D 5000 Cologne, both of Fed. Rep. of Germany

[21] Appl. No.: 898,804

[22] Filed: Apr. 24, 1978

[30] Foreign Application Priority Data

Nov. 7, 1977 [DE] Fed. Rep. of Germany ....... 2749681

[51] Int. Cl.³ .............................................. G01R 33/00
[52] U.S. Cl. .................................... 324/228; 324/262
[58] Field of Search ............... 324/200, 201, 205, 222, 324/221, 239, 243, 260, 261, 262

[56] References Cited

U.S. PATENT DOCUMENTS 2,315,045  3/1943  Breitenstien .................... 324/243

OTHER PUBLICATIONS

A. P. Mills Jr. "Method for Measuring Magnetic Moments with Precision" *Journal of Applied Physics* vol. 45 No. 12 Dec. 1974 pp. 5440-5442.
*Magnetik Electro-Physik,* Apr. 1974, Hans nix et al. Institut für Magnetik U. Messtechnik pp. 2-3, and 26.

*Primary Examiner*—Gerard R. Strecker
*Assistant Examiner*—Walter E. Snow
*Attorney, Agent, or Firm*—Fisher, Christen & Sabol

[57] ABSTRACT

Apparatus for measuring the magnetic moment M of a body consists of generating a magnetic field by means of a permanent magnet having high coercive field strength and low recoil permeability $\mu_r$, with a measuring coil positioned in the magnet field to make measurements when the body is moved in that field.

17 Claims, 9 Drawing Figures

MAXIMAL MEASUREABLE VALUES
OF $J_s$ LIMITED BY DEMAGNETIZATION
FACTOR N AND COERCIVITY $H_{cJ}$
(CIRCLE ON THE $H_s$-ORDINATE)

APPARATUS FOR MEASURING THE MAGNETIC MOMENTS OF A BODY USING A MAGNETIC FIELD GENERATED BY A PERMANENT MAGNETIC

This invention relates to a magnetic moment-measuring apparatus and its use for measurement of the magnetic properties of hard, soft and weak magnetic materials and the bodies produced from them as well as for testing nonmagnetic materials for determination of magnetic particles or impurities.

The magnetic moment M of a body is defined as:

$$M = J \times V$$

when J=polarization and V=volume of the body.

The polarization J is defined as: $J = B - (\mu_o \times H)$ (with B=magnetic flux density, $\mu_o = 0.4\pi \times 10^{-6}$ Volt second/Ampere meter and H=magnetic field strength) and can be determined from the measured magnetic moment M:

$$J = M/V$$

Measurement of the magnetic moment of a body with a long cylindrical coil is known, in which exists a magnetic field produced from a second, excited coil surrounding it, and which is attached to an integrating measuring device such as a fluxmeter (A. P. Mills, Journ. Appl. Phys, Vol. 45, No. 12, 1974, p. 5440–5442, FIG. 3). For the measurement, the body to be measured is moved into the coil and the signal appearing thereby on the measuring device is evaluated.

This known measuring arrangement has the disadvantage that for production of a necessary high field, e.g. to reach magnetic saturation $J_s$, there is a higher cost outlay for the field, coil and for its power supply. Also, the current must be held at an extremely constant value, because each current fluctuation causes a field variation, which produces a voltage in the measuring coil and causes an indication similar to a variation of the magnetic moment to be measured.

In this invention, the constant magnetic field in the measuring coil is produced by permanent magnets arranged closely against it or in it, which have a working point corresponding to a low recoil permeability $\mu_r = dB/dH$.

With the use of these permanent magnets, on the one hand the magnetic field is held very constant, so that a measuring coil with a high number of windings can be used, whereupon a high precision measurement is obtained. On the other hand, a low recoil permeability $\mu_r$ is necessary to avoid a change in polarization of the permanent magnets themselves with the introduction of the sample to be measured, which would be included in the measurement and provoke an error. This error can be avoided by using according to the invention permanent magnets of a recoil permeability $\mu_r$ of less than 2 Gauss/Oersted, especially of less than 1.2 Gauss/Oersted. Such permanent magnets are for example made from rare earth-cobalt alloys, from high coercive alnico alloys or from hard ferrites.

Figure 4:
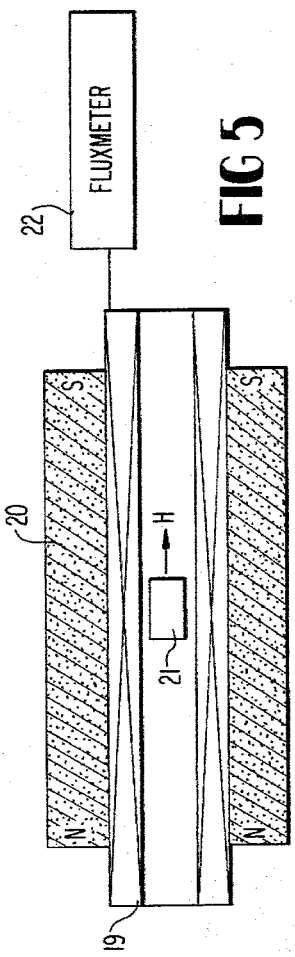
Figure 5:
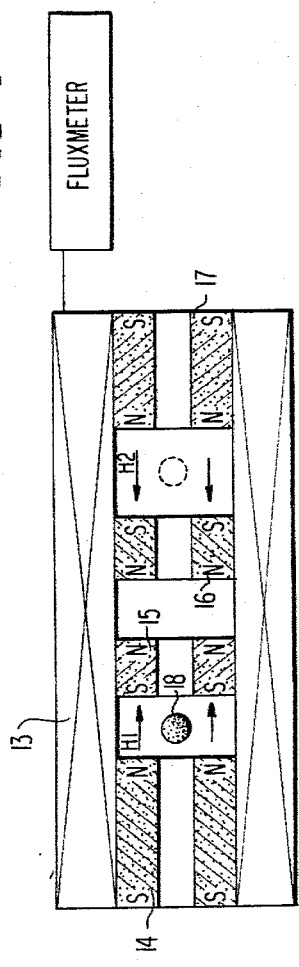
Figure 6:
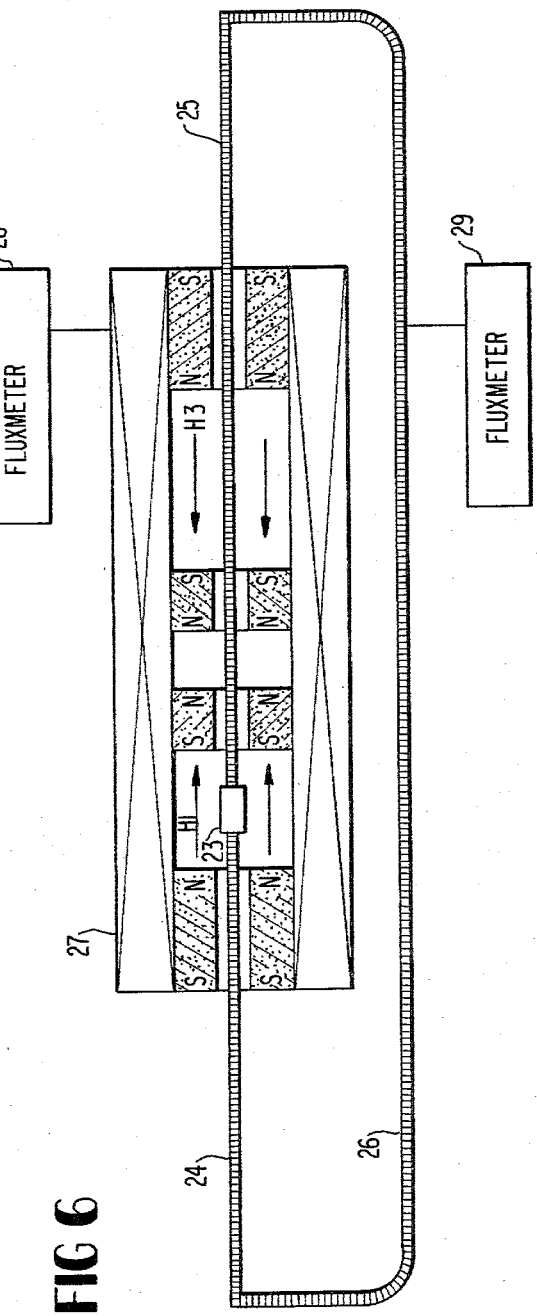
Figure 7:
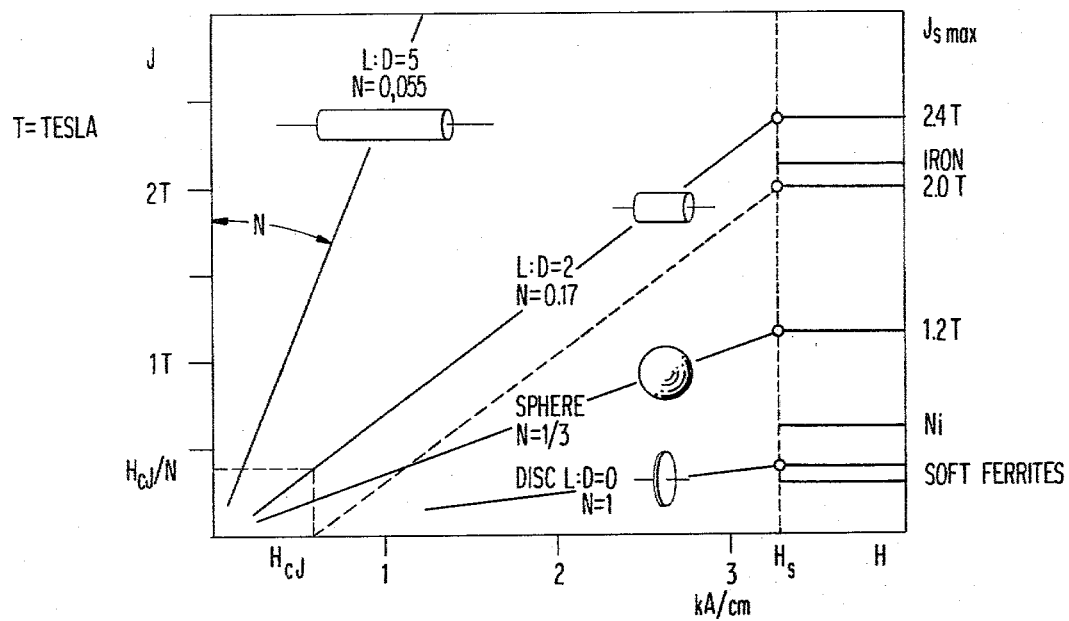

FIGS. 4, 5, and 6 are axial cross-sections of three further modified forms of the invention, and FIG. 7 is a diagram showing maximum measurable values of $J_s$ as limited by the demagnetization factor N and coercivity $H_{cJ}$.

Figure 1:
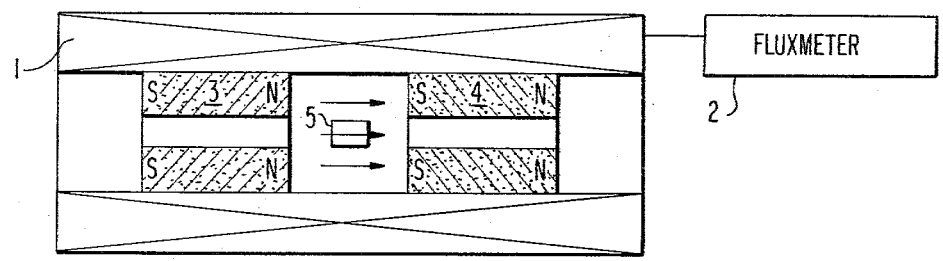
FIG. 1 is an axial cross-section of a preferred form of magnetic moment measuring apparatus in accordance with this invention.

An example of the invention is shown in FIG. 1, wherein numeral 1 is the measuring coil with a high number of windings, connected to a fluxmeter 2. Numerals 3 and 4 are cylindrical permanenet magnets provided with an axial bore with the poles N and S creating between them the magnetic field H. Numeral 5 is the sample to be measured. Introducing the sample 5 in the shown position into the center of the coil between the two permanent magnets 3 and 4 a magnetic moment M will be indicated by the fluxmeter 2. If the volumn V of the sample is known, the polarization $J = M/V$ can be obtained for the external field intensity H.

Taking account of the demagnetizing factor N (depending on the dimension relationship L: D=length-:diameter of the sample) the internal field intensity $H_i$ can be evaluated by the formula:

$$H_i = H - (N \times J)$$

If the external field H is high enough to obtain the magnetic saturation polarization $J_s$ of the sample, the measurement will be independent of the dimensional relationship of the sample. The invented measuring equipment is therefore best suited for the measurement of the saturation polarization $J_s$.

Figure 2:
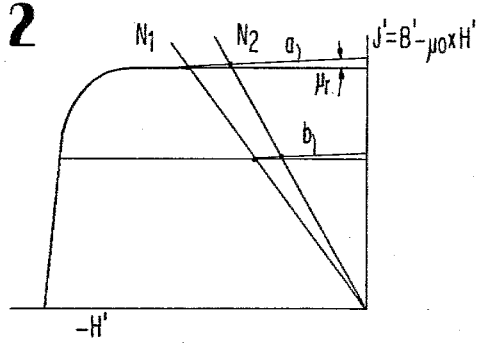
FIG. 2 represents, a typical demagnetization curve for magnets suitable for use in this apparatus.

FIG. 2 shows a demagnetization curve $J'(H') = B' - (\mu_o \times H')$ of the permanent magnet material proposed by the invention, in which J'=polarization, B'=flux density and H'=internal field density of the permanent magnets used for producing the field H between them. Letter a is an outer demagnetization curve, and letter b an inner one. $N_1$ is the load line corresponding to the geometrical dimensions of the permanent magnets 3 and 4 and to the distance between them. When the sample 5 to be measured is introduced in the magnetic field H between the magnets, their load line moves to $N_2$. As, according to the invention $\mu_r$ has a low value, the demagnetization curve is practically horizontal and practically no change of J' of the permanent magnets 3 and 4 occurs; only the magnetic moment M of the sample S is measured, from which the polarization J of the sample results. In FIG. 2 the distance between the load lines $N_1$ and $N_2$ is shown on an enlarged scale to be better explained.

Figure 3:
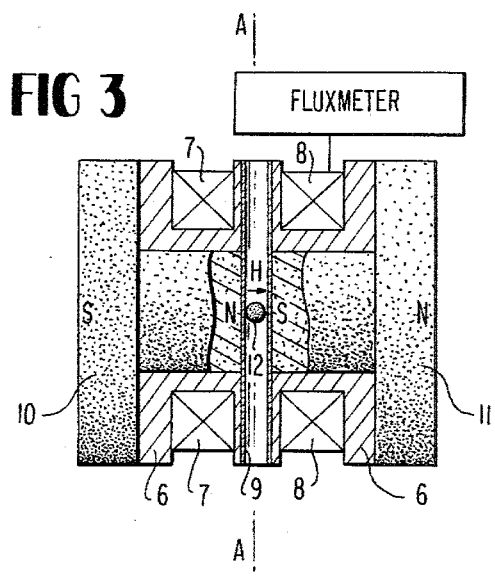
FIG. 3 is a cross-section of a modified form of apparatus taken along the axis of the tubular measuring chamber.
Figure 3A:
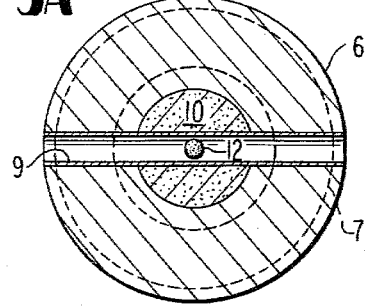
FIG. 3A is a cross-section taken on the line A—A of FIG. 3.
Figure 3B:
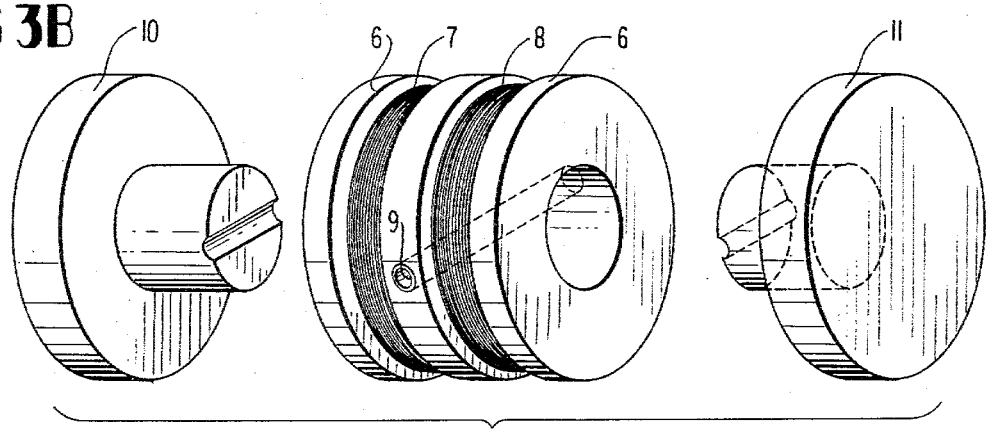
FIG. 3B is an exploded view of the device of FIG. 3.

The limitation of the dimension of the sample to be tested by the diameter of the permanent magnet bore and the lack of homogeneity of the field does not appear with another embodiment of the invention, which is shown in FIG. 3. In that drawing, numeral 6 indicates the coil bodies of a Helmoholtz coil with windings 7 and 8. Numeral 9 is a tube of nonmagnetic material, such as brass, in the transverse bore of the coil body; and numerals 10 and 11 each represents a permanent magnet with poles N and S, which produces the field H. A sample 12 to be measured will be inserted in tube 9, with the results that a fluxmeter connected with the coils 7 and 8 which are connected in series indicates the polarization J corresponding the field strength $H_i$ when the volume V of the probe, is known. The influence of the demagnetization factor N is to be considered hereby, as explained above.

According to the invention, the magnetic moment of a body is properly measured if the body is situated in the area in which the measuring coil would produce a homogeneous field when a current flows through it. The area available for measurement is particularly large with the Helmholtz coil.

Another embodiment of the invention is shown in FIG. 4. In the measuring coil 13, which is connected with a fluxmeter, are closely mounted the permanent magnet pairs 14/15 and 16/17, which produce two oppositely directed fields $H_1$ and $H_2$. By introducing the sample 18 into the field $H_1$, a polarization $J_1$ is produced in the first quadrant of the hysteresis curve. The working point of the sample is moved into the second quadrant by moving the sample further into the oppositely directed field $H_2$. If field $H_1$ is so strong that the saturation polarization of the sample is obtained and if field $H_2$ is so strong that the corresponding intrinsic field strength $H_{2i}$ is greater than the coercive field strength $H_{JC}$ of the polarization, then $J_2$ will become negative. With suitable selection of the value of $H_2$, a body can be tested in a simple manner for saturation polarization and for a predetermined coercive field strength $H_{JC}$.

The setting of a predetermined field strength $H_1$ and $H_2$ between the permanent magnets can be accomplished by variation of their distance or by setting of other working points of the permanent magnets on a lower inner magnetization line (recoil line b in FIG. 2) e.g., by incomplete magnetization or by demagnetization to the desired value; the latter is to be preferred on account of the great stability of the working point which is so obtained.

FIG. 5 shows a magnetic moment measuring coil 19 according to the invention, in which the magnetic field H is produced by a permanent magnet 20 with poles N and S which surrounds the outside of the measuring coil. In the inner homogeneous area of field H the body 21 to be measured is introduced; the resulting indication of fluxmeter 22 gives its magnetic moment and from that, with known volume, its polarization J.

The complete hysteresis curve of a body can be measured if in addition to the polarization J, its intrinsic field $H_i$ is also measured, as with a potential-measuring coil to determine the potential difference $H_i \times L$ between the ends of the body (L=length of the body). Such a measuring arrangement is shown in FIG. 6. The body 23 to be measured is held between the ends of a potential coil consisting of three parts 24, 25, and 26 having a uniform winding area density, and is moved out of the field $H_1$ effecting the saturation in the 1st quadrant by the distance a into field $H_3$ effecting the saturation in the 3d quadrant of the hysteresis curve. The measuring coil 27 according to the invention is attached to a fluxmeter 28 measuring the polarization and the potential coils 24, 25, and 26 are connected in series to the fluxmeter 29. Both fluxmeters are connected with the corresponding connections of a X-Y-recorder, which will generate the $J(H_i)$-curve. Thereby, the precision of fluxmeter 29 must be controlled in a known manner by the factor L, in order to take account of the length of the body by calculating $H_i = H_i \times L/L$ from the measured value $H_i \times L$.

As the inner field $H_i$ in a sample is reduced by the demagnetization factor N, the maximum saturation which can be measured with the field $H_s$ is: $J_s$ $max = (H_s - H_i)/N$. This is shown in FIG. 7 in which the values of J are plotted vertically and values of H horizontally. Various demagnetization factors N are represented by the inclination of the solid lines, with these values, as well as typical shapes of samples, identifying the lines. Furthermore, if the sample has a coercivity $H_{cJ}$ this cannot be ignored, as the value will be reduced by the amount $H_{cJ}/N$. For example, FIG. 7 shows that if a sample has a length to diameter ratio of 2 and $H_{cJ}$ is zero, the maximum saturation which can be measured is 2.4T, as shown by the small circle on the vertical broken line representing the ordinate $H_s$. However, if the sample has the same length to diameter ratio, but a value of $H_{cJ} = 0.5$ kA/cm the maximum saturation which can be measured is only 2.0T, as shown by the inclined broken line. A further limit to the value of $J_{s\,max}$ can be caused by the only slow approach of J to its maximum value with increasing values of H. Other values of $J_s$ $max$ are shown by small circles on the $H_s$ ordinate and approximate ranges for iron, Ni and soft ferrites are shown at the right of the diagram.

The apparatus herein disclosed is not only capable of measuring the magnetic properties of hard (permanent magent), soft, or weak magnetic materials and articles made of these materials as soft ferrites, recording tapes, memory cores but it can also be used for testing the magnetic particle content of nonmagnetic materials or to determine the presence of magnetic impurities.

We claim:

1. In apparatus for measuring the magnetic moment M of a body, said apparatus including means for generating a magnetic field having a controlled value H and subjecting said body to said field by moving it into or out of the field, and a measuring coil positioned in said magnetic field positioned to be responsive to the magnetic moment of the body in that field, the improvement which comprises a permanent magnet having a value of recoil permeability $\mu_r$ of less than 2 Gauss/Oersted for generating said controlled magnetic field.

2. The apparatus of claim 1, wherein said recoil permeability $\mu_r$ is less than 1.2 Gauss/Oersted.

3. The apparatus of claim 1, wherein said permanent magnet comprises a rare earth-cobalt alloy.

4. The apparatus of claim 1, wherein said permanent magnet comprises an aluminum nickel alloy.

5. The apparatus of claim 1, wherein said permanent magnet comprises a hard ferrite.

6. The apparatus of claim 1, wherein said measuring coil is connected with an integrating measuring device.

7. The apparatus of claim 6, which includes an additional potential coil connected to opposite ends of said body for measuring the inner field strength $H_i$ of said body.

8. The apparatus of claim 1, wherein the magnetic field generated by said permanent magnet is concentrated in a space coinciding with that which would be defined by the homogeneous magnetic field having the uniformity for measuring which would be generated by passing a current through the measuring coil.

9. The apparatus of claim 8, wherein the magnetic field is adjusted by adjusting the working point of the permanent magnet.

10. The apparatus as claim 1, wherein said measuring coil is tubular in shape and the magnetic field generated by said permanent magnet is concentrated in a space defined by an elongated tube coaxial with the measuring coil.

11. The apparatus of claim 10, wherein said permanent magnet comprises an axially magnetized permanent magnet surrounding the exterior of the measuring coil.

12. The apparatus of claim 10, wherein the magnetic field H is generated by at least two permanent magnets provided with bores aligned with said measuring coil therein.

13. The apparatus of claim 12, wherein the strength of said magnetic field can be varied by adjusting the space between said two permanent magnets.

14. The apparatus of claim 1, wherein said measuring coil comprises a Helmholtz coil, and said magnetic field is generated by a pair of axially magnetized permanent magnets, the end pole of one of the magnets being in abutting engagement with the end pole of opposite polarity of the other magnet whereby said magnets generate a magnet field which is coaxial with said Helmholtz coil, the end faces of the abutting poles being transversely recessed to provide a transverse bore to receive a body to be measured.

15. The apparatus of claim 12, wherein said measuring coil is connected with an integrating measuring device.

16. The apparatus of claim 12, wherein said magnetic field is generated by two pairs of permanent magnets, the poles of one pair being arranged in opposition to the poles of the other pair.

17. The apparatus of claim 16, wherein a single measuring coil cooperates with both of said pairs of permanent magnets, whereby the saturation polarization of a body can be measured in that portion of the field generated by one pair and the coercive field strength of said body can be measured in that portion of the field generated by the other pair.

* * * * *